United States Patent [19]

Cohen

[11] 4,124,839
[45] Nov. 7, 1978

[54] ELECTRO-OPTICAL METHOD AND SYSTEM ESPECIALLY SUITED FOR REMOTE METER READING

[76] Inventor: Murray F. Cohen, 102 Overlook Ter., Roslyn Heights, N.Y. 11577

[21] Appl. No.: 753,697

[22] Filed: Dec. 23, 1976

[51] Int. Cl.² .......................... G08C 19/00; H04Q 9/00
[52] U.S. Cl. ..................................... 340/151; 340/150; 340/188 R; 340/204
[58] Field of Search ................... 340/151, 188 R, 204, 340/150; 250/231 SE

[56] References Cited

U.S. PATENT DOCUMENTS

| | | | |
|---|---|---|---|
| 3,196,277 | 7/1965 | Rabinow | 340/188 R |
| 3,662,368 | 5/1972 | Farnsworth | 340/204 |
| 3,802,779 | 4/1974 | Fletcher | 250/231 SE |
| 3,820,096 | 6/1974 | Himmelsbach | 340/188 R |
| 3,846,789 | 11/1974 | Germer | 340/188 R |
| 3,862,428 | 1/1975 | Waters | 250/231 SE |

*Primary Examiner*—Harold I. Pitts
*Attorney, Agent, or Firm*—Posnack, Roberts, Cohen & Spiecens

[57] ABSTRACT

Coded cylindrical drums mounted on the pointers of dials of a meter are provided with parallel axially aligned rows of data elements constituted by opaque and transparent areas. Each of the drums is provided with a transparent centrally located ring parallel to the rows. Light is transmitted diametrally through the drums thereby intersecting the same at two places. So that the light will scan the rows as they are brought into position and so that the light can escape through the transparent ring, the light is converged at two spaced and orthogonally related lines for each drum. This is accomplished by passing the light through a positive aspherical or a spherical lens and cylindrical lens in series. The light is thereby converged at two orthogonally related lines respectively located at a shortened focal length due to the added power of the cylindrical lens and at the positive lens' normal focal length. The difference of the two focal lengths corresponds to the cylindrical drum diameter. A masking arrangement can be utilized to expose the data elements in sequence to reduce the photoelectric elements necessary for data pickup. The masking arrangement can provide synchronization pulses to identify the data elements. A transponder transmits the collected data to a remote central station.

31 Claims, 11 Drawing Figures

ELECTRO-OPTICAL METHOD AND SYSTEM ESPECIALLY SUITED FOR REMOTE METER READING

FIELD OF THE INVENTION

This invention relates to electro-optical methods and systems and, more particularly, to methods and systems suitable for the reading of meters.

BACKGROUND OF THE INVENTION

Public utilities have recently been developing methods and systems to support computerized power management. Much of the impetus for such automated power management comes as a result of the massive power failure that occurred in the fall of 1966. At that time, it became evident that some kind of centralized grid control would be needed to provide an overall fail safe method for preventing similar occurrences in the future.

A part of such an overall electric-power management system will entail the use of an automatic, electric-meter readout device which will adapt to existing home and industrial meters and eliminate the need for individual readout of meters by utility employees or the like.

U.S. Pat. No. 3,733,586 discloses a special communications system which can be used to feed data directly into power lines. Thus, the same wires that connect power into a home or other utilization zone can be used to transmit communications signals. This system opened the door to the possibility of automatic meter readout without the necessity of stringing extra wires to each subscriber for that purpose.

However, a present obstacle exists which, thus far, has prevented widespread use of automatic metering systems. This obstacle is the lack of an inexpensive device which can be adapted to the already installed house meters and which can transmit signals over power lines on command. Since the public utilities have many millions of dollars tied up in house and industrial meters, which are designed to last from twenty-five to forty years, it is understandable that the expense of replacing the present meters, with new ones having the desired automated readout capability, would be financially undesirable. Thus, a device which can be readily adapted to the various meter types, of which there are many, must be inexpensive, easily installable, and trouble-free for the life of the meter.

A number of automatic readout adapters have been developed and these are of two general categories of design. A contact method, which is inexpensive, has been ruled out because it causes excessive drag on the meter mechanism, thereby invalidating the calibration. The second category involves the electro-optical readout of meter dials. The latter method is desirable because it eliminates physical contact with the metering dials. However, to date, all such techniques have proven very expensive.

SUMMARY OF THE INVENTION

It is an object of the invention to provide an improved electro-optical method and system.

It is another object of the invention to provide an improved electro-optical method and system especially suited for remote meter reading.

Another object of the invention is to provide an improved electro-optical method for the reading of meters, which is especially suited for use with previously installed meter systems.

Yet another object of the invention is to provide an improved electro-optical method for meter reading which system and method are economical to employ.

Still another object of the invention is to provide improved methods and systems, which are suitable for the remote sampling of meter systems.

According to one aspect of the invention and to achieve the above and other objects of the invention, there is provided an apparatus comprising coding means adapted for being interrogated by electromagnetic rays along a first plane at a first station and for passing said electromagnetic rays through a second plane angularly related to said first plane in a second station spaced from first station, said planes intersecting generally along a line passing through both said stations, means for transmitting electromagnetic rays such that the same pass through said first plane in said first station and said second plane in said second station, and utilization means to receive the electromagnetic rays from the second station.

Said coding means may include a cylinder or cylindrical drum having an axis of symmetry and may have thereon encoded information adapted for being scanned by electromagnetic waves along said first plane which is parallel to said axis, said cylindrical drum further including an area in said second plane which is perpendicular to said axis and which is transparent to said electromagnetic waves.

According to another aspect of the invention, said coding means includes at least two connected portions adapted to intersect the electromagnetic rays in respective of said stations, said portions being displaceable about an axis of rotation and having thereon encoded information adapted for being scanned by electromagnetic waves along said first plane which, as aforesaid, is parallel to said axis, said portions further including an area in said second plane which is perpendicular to said axis and which is transparent to said electromagnetic waves.

According to another aspect of the invention, there is provided a dial including indicia of values and provided with a dial pointer operatively associated with said dial and displaceable relative thereto for selectively indicating selected of said values, said cylindrical drum being displaceable with said pointer for the encoding of the selected values.

According to another view of the invention, apparatus is provided comprising first means providing a path for electromagnetic rays which path passes sequentially through two spaced and angularly related lines, second means for modulating said rays at one of said lines according to a code, and third means for responding to the rays at the other of said lines and converting the modulated rays into signals of a different form of energy.

According to a further development of this aspect of the invention, there is provided a source of light constituting said electromagnetic rays, said first means converging said light at said first and second lines respectively.

The source of light mentioned above may be an L. E. D. The second means may include a carrier having areas substantially opaque and transparent to said light and arranged according to a code. This code may be a binary code, an analog code or a gray code.

The carrier mentioned above may be in the form of a closed loop arranged to intersect said path at both said lines, said carrier having a transparent zone corresponding to one of said lines. More particularly, the carrier may be cylindrical and the said zone may be a transparent ring encircling the carrier.

According to another aspect of the invention, there may be provided means to modulate the light source at an identifiable frequency. The carrier, moreover, may be provided with an unimpeded path between the aforesaid lines.

Further, the first means may comprise in sequence a positive spherical or aspherical lens having a characteristic focal length and producing a convergent light beam, and a cylindrical lens arranged to pass said convergent light beam, the first line resulting at said focal length of the positive lens shortened by the added power of the cylindrical lens and the second line resulting at said characteristic focal length.

According to another aspect of the invention, there may be provided a dial having measurements thereon and a pointer operatively associated with said dial to point to said selected measurements thereon, the cylindrical carrier being operatively associated with and moveable with the pointer for the encoding or modulating of said rays.

According to still another aspect of the invention, there may be provided a displaceable mask having light permeable regions therein for selectively rendering a limited number of said areas effective at a given time. This limited number may be a single area, which will be rendered effective at a given time.

Viewing the invention from still another aspect, there may be provided apparatus comprising a plurality of dials having data indicia thereon, pointers operatively associated with respective of said dials and movable to point to selected of said indicia, source means to direct light across the dials, encoding means having areas of different respective permeability to light and displaceable with said pointers to modulate said light according to the positions of the pointers, masking means for selectively rendering said areas effective, and transducer means to receive light from the effective areas for the generation of a corresponding electrical signal.

In the aforesaid, said areas may be arranged in rows in each of which the areas combine to provide a coded representation of data, said masking means sequentially rendering the areas in one of said rows effective. The encoding means may be operatively associated with respective of said dials and pointers and said masking means may render active only one of the encoding means at a time.

Furthermore, the masking means may provide for generating a synchronization signal for identifying the areas which are rendered effective. Moreover, the apparatus may comprise a light source and photoelectric means operatively associated with the masking means to generate said synchronization signal consisting of a sequence of pulses, and electronic counting means to count said pulses.

According to a further aspect of the invention, there may be provided power means actuated by an externally supplied signal to actuate the aforesaid source means.

According to yet another aspect of the invention, there may be provided modulating means for modulating said source means and light source to different frequencies, said transducer means and photoelectric means generating respective pulses modulated at different frequencies.

According to still another aspect of the invention, there may be provided transponder means for transmitting said pulses to a remote central station.

According to an important feature of the invention, there may be provided means to convert said light at two spaced and angularly related lines, one of which is at said encoding means and the other of which is operatively disposed relative to said transducer means.

According to another view of the invention, there may be provided apparatus comprising a dial, a pointer moveable relative to said dial, an encoder superposed above said dial and moveable with said pointer, a light source transmitting light across said dial and intersecting with said encoder at two zones, said encoder having thereon rows of areas for modulating said light at one of said zones and further having a transparent line for permitting the passage of said light at the other of said zones, the transparent line being orthogonally related to said rows, and there being furthermore provided a lens system between said source and encoder for converging the light to a line parallel to said rows at said one zone and to a line substantially coincident with said transparent line at the other zone.

In the latter approach to the invention, said lens system includes a positive lens and cylindrical lens in series, said positive lens having a characteristic focal length and a focal length shortened by said cylindrical lens.

According to still another aspect of the invention, there is provided a method comprising optically examining parallel rows of optically characterized data elements passing in opposite directions through two spaced stations and provided with a light permeable channel angularly arranged relative to and passing through said rows, the optical examination of the rows being effected by directing light through the stations and converging the light at spaced lines corresponding to said stations with the lines being angularly related according to the angular relationship of the rows and channel.

In the above described method, the lines may be orthogonally or perpendicularly related. Moreover, the method may comprise driving the rows through the station in correspondence with the movement of a pointer on a dial.

Still further, the light may be converged by passing the same as aforesaid through a positive lens and a cylindrical lens in sequence. The stations may be spaced at a distance corresponding to the difference between the focal length of the positive lens and said focal length modified by the cylindrical lens.

According to still another aspect of the invention, there is provided an optical arrangement reversing the order of the line images so that, at the first station, the image passes through the transparent ring and, at the second station, the line image intersects the rows containing the optically characterized data.

Effecting the reversal of the optical imaging at the front station and the second station takes place by rotation of the cylindrical lens by 90° so that the line image formed at the first station is perpendicular to the optically characterized row of data and the second line image formed at the second station is parallel to the optically characterized data.

In this latter case, interrogation of optically characterized data is effected by an array of photodetectors, simultaneously detecting all of the rows of data. This achieves the elimination of a motorized scanning mask which as heretofore mentioned was used to examine each of the optically characterized rows of data, singly and in sequence. This requires the use of electronic circuit techniques which effectively scan simultaneously examined photoelectric detectors and transmits the data sequentially on a single data output channel, thereby accomplishing what the sequential scanning mask had accomplished in the previous embodiment.

The above and further objects and features of the invention as well as advantages thereof will become more apparent from the detailed description of some preferred embodiments which follow hereinafter.

DETAILED DESCRIPTION

Figure 1:
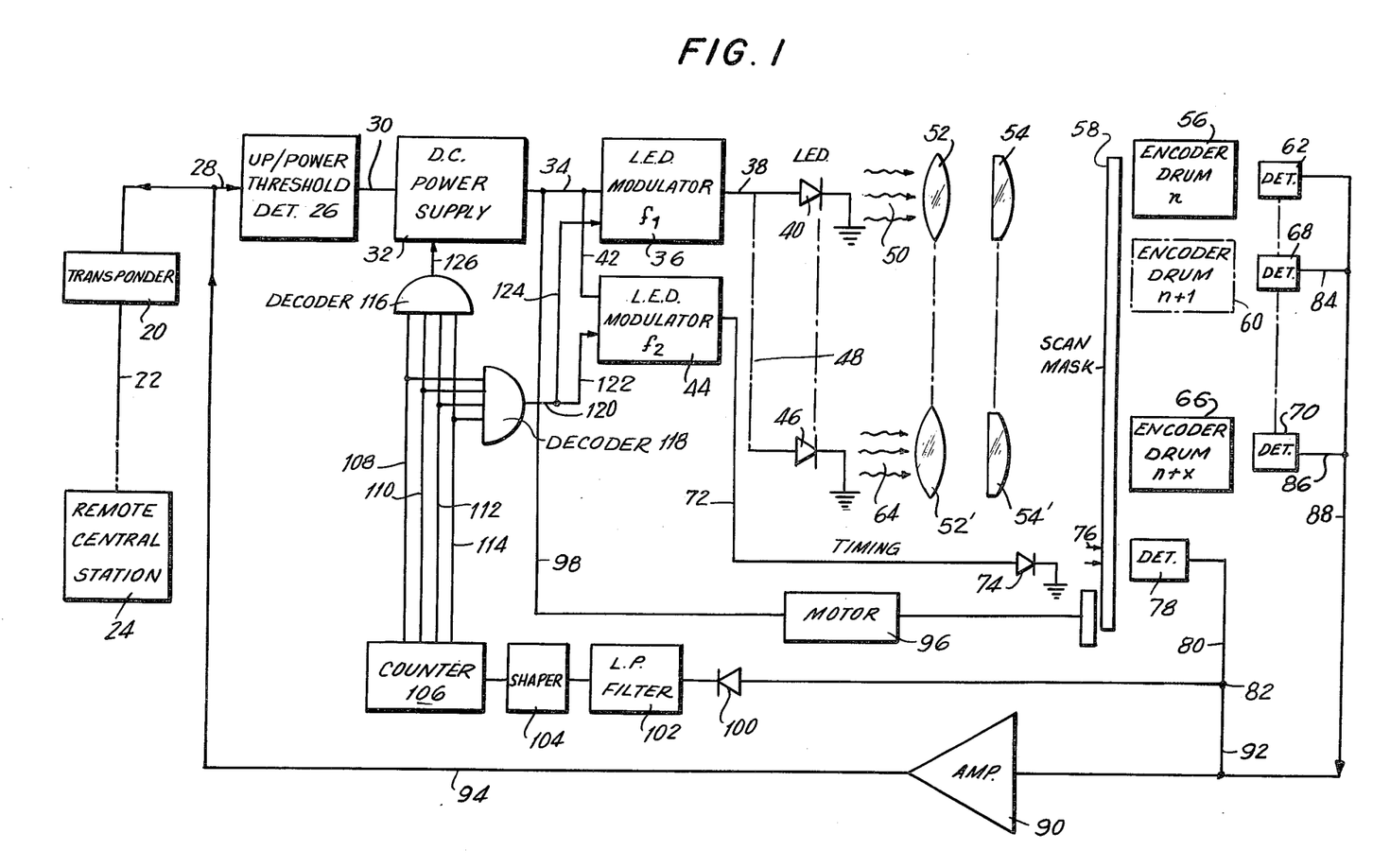
FIG. 1 is a partially block, partially diagrammatic illustration of a preferred embodiment of the invention illustrating the encoding of beams of light.

In accordance with the invention, there is provided an automatic meter encoder which works in conjuction with a transponder, which is commercially available for automatic readout. More particularly, the transponder may be such as has been indicated in U.S. Pat. No. 3,733,586. With reference to FIG. 1, the transponder is indicated at 20 and is connected via a line 22 to a remote central station indicated at 24. The remote central station may be a station adapted for collecting data from meters situated at remote stations and may also be a utility transmitting power via line 22 and via transponder 20 to the circuitry and system provided in accordance with the invention. It will be understood that data from the meters can be transmitted along the very same lines which are transmitting power or separately therefrom, neither of these arrangements being the concern of the present invention.

The transponder may function to coordinate signals from a centralized data terminal to the individual utility meters. The transponder may send a read command signal to the automatic meter encoder and the automatic meter encoder will read out the data being indicated on the various dials of the different meters and relay the information to the central station 24 and particularly to the computer therein via the transponder 20.

Signals generated in the automatic meter readout, as will be hereinafter indicated, are electro-optically derived digital or analog signals generated by the action of a modulated light emitting diode (L.E.D.) processed sequentially through a scanning mask and drum encoder as described hereinafter.

The input from the transponder sets the power for the system, thereby providing power for the L.E.D. or L.E.D.'s, a scan motor, amplifiers and digital logic.

A signal from the transponder, more particularly, provides power at the D.C. power supply to be indicated hereinafter. Light beams from the L.E.D.'s are sequenced into the encoder drums at a first modulated frequency $f_1$. A second L.E.D., as will be described, is modulated at the frequency $f_2$ which serves as the timing for the encoder. The encoder signal at $f_1$ and the timing signal at $f_2$ are combined and sent out through the transponder back to the remote central station 24. The signal $f_2$ serves as a presence signal to look for "ones" and "zeros" transmitted at frequency $f_1$. The $f_2$ signal may be in half-wave rectified form and filtered in order to operate a counter. Such counter is used first to turn off the L.E.D.'s after the aforesaid mask has moved to extreme forward position and, secondly, to turn off the scanner motor after the motor reverses back to its start position.

This action is used to drive the motor in reverse to come back to a starting position. The L.E.D.'s must turn off after all data has been processed so that the reversing action of the mask does not deliver redundant or erroneous data to the transponder.

Referring more particularly to FIG. 1, there is seen an up/power threshold detector 26, which is coupled to the transponder 20 via line 28 and which receives a signal therefrom for purposes of being actuated in order, in turn, to actuate via a line 30, a DC power supply 32. The DC power supply is coupled, for example, via a line 34 to an L.E.D. modulator ($f_1$) indicated at 36, which in turn is connected via line 38 to L.E.D. 40. At the same time, line 34 is connected via line 42 to L.E.D. modulator ($f_2$) indicated at 44. It will be realized that when the power supply 32 is actuated, a signal is received from the threshold detector 26, whereby power is caused to be transmitted via lines 34 and 42 to L.E.D. modulators 36 and 44, or whatever other L.E.D. modulators may be included in the system. It will be noted in FIG. 1 that an L.E.D. 46 is coupled via a line 48 to the L.E.D. modulator 36. The dotted line suggests that additional L.E.D.s may be connected between L.E.D.s 40 and 46, whereby to service a plurality of encoder drums in the manner to be described below.

The L.E.D. 40 directs a beam or rays of light via path 50 to an optical system consisting of a positive lens 52 and a cylindrical lens 54. This system will be discussed in greater detail hereinafter. The light passing through this system of lenses impinges on an encoder drum 56, which may be one of a plurality of encoder drums, each of which is associated with a dial of a meter, as will be later described. Whether or not light impinges on a particular section of the drum 56 is controlled by a scan mask 58, as will be referred to in greater detail hereinbelow.

In FIG. 1 is furthermore shown an additional encoder drum ($n + 1$) at 60. This drum indicates that a series of drums may be incorporated, each of which will be serviced by a lens system such as has been referred to at 52 and 54 hereinabove. A photoelectric detector indicated at 62 is employed to pick up light passing through the encoder drum 56, as will be described hereinafter.

Also to be noted in FIG. 1 is the emission of a light beam or the like in the form of rays indicated at 64, such light rays also passing through a positive lens 52' and a cylindrical lens 54' constituting an optical system to be discussed in detail hereinbelow. Scanning mask 58 operates to selectively intercept the light passing through this lens system and to selectively pass light onto an encoder drum (n + X) indicated at 66, this being the last of the series. Shown by way of illustration are photoelectric detectors 68 and 70, these picking up the light passing through the additional encoder drums, all of which will be described hereinbelow.

Reference was made above to L.E.D. modulator ($f_2$) 44. The power from this modulator passes via line 72 to an L.E.D. 74, the light from which passes as indicated at 76 through the scan mask 58 to be picked up by a photoelectric detector 78, the output of which passes along line 80 to a junction 82. A signal generated by detectors 68 and 70 passes, generally, via lines 84 and 86 along with the signal from detector 62 into line 88 and thence into an amplifier 90, which also receives a signal from detector 78 via junction 82 and line 92. The signal amplified by amplifier 90 consists of pulses carrying modulated information suitable for distinguishing between the pulses generated by the L.E.D.'s other than L.E.D. 74, on the one hand, and the L.E.D. 74 on the other hand. This information passes via line 94 to the transponder 20 and via line or cable 22 back to the remote central station 24.

It is now suitable to note that a motor 96 is provided. The principle function of the motor 96 is to drive or displace the scan mask 58 in its scanning motion, as will be described hereinafter. Motor 96 receives its power via line 98 from the D.C. power supply 32 which is actuated, as has been noted above, by a signal received from threshold detector 26.

It is further suitable to note that the signal appearing at junction 82 and received from detector 78 is rectified by diode 100 and then passed through a low pass filter 102 to a shaper 104 whereby the pulses which are generally square wave or rectangular wave in form are sharpened and passed to a counter 106. Therein, the received pulses are counted. They are decoded by being sent along lines 108, 110, 112 and 114 which feed, respectively, to decoders 116 and 118. When an appropriate count is determined by decoder 118, a signal passes via lines 120, 122 and 124 to L.E.D. modulators 36 and 44 to turn off the same. This, as has been noted above, will prevent the device from passing improper signals out to the transponder 20 when the direction of the scan mask 58 is reversed by motor 96 to bring it to its original position.

Decoder 116 decodes the signals on lines 108, 110, 112 and 114 and, when a proper count has been determined, transmits a signal via line 126 to the DC power supply 32, which thereby turns off the power at lines 34 and 98 in sequence ultimately bringing motor 96 to a halt and indicating that the motor has brought the scan mask 58 back to its starting position. It will be noted, as has been indicated hereinabove, that the DC power supply 32 is actually turned off following the turning off of the L.E.D. modulators such that, for the reasons which have been given, L.E.D. modulators 36 and 34 remove the power from the various L.E.D.s to prevent a reverse count.

As will be described in greater detail hereinafter, during the aforesaid process, the encoder drums 56 and so forth, modulate or otherwise vary the light intensity passing through to the associated detectors in order to supply information thereto in digital or analog form.

Figure 2:
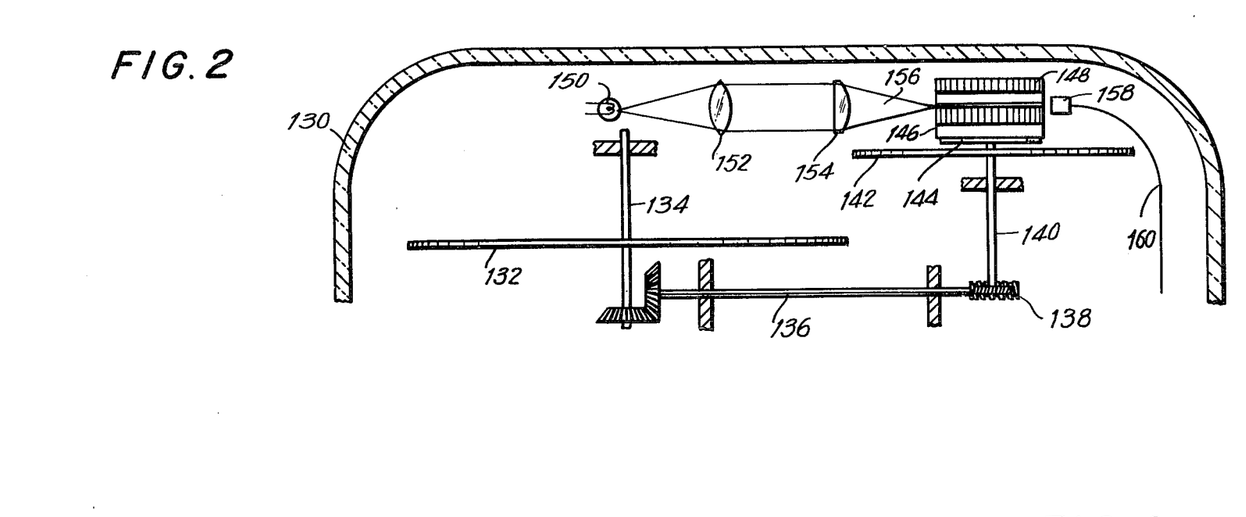
FIG. 2 is a diagrammatic illustration of part of an adapted meter illustrating the physical adaptation of a meter in accordance with the invention.

FIG. 2 illustrates diagrammatically the glass cover 130 of a conventional utility meter of the kind normally found mounted on the outside of a dwelling or commercial structure or the like for purposes of indicating the amount of power consumed within such structures. Heretofore, these meters have, generally, been inspected by personnel who act as meter-readers. In the present case, it is desired to inspect these meters automatically and transmit the information therefrom electronically to a remote station whereat a computer can do the necessary work to compute power consumption and to calculate billings with respect thereto.

The construction within the cover 130 is given by way of illustration only and is not intended to illustrate a complete operative meter in its form as may normally be employed. Within the cover 130 is illustrated a metering wheel 132 mounted on a spindle 134 and adapted to drive via a linkage 136, a gearing section 138, the purpose of which is to rotate the shaft 140 in accordance with the amount of power consumed. Only one shaft 140 is indicated and it will be realized that such meters normally contain a plurality of such shafts and a plurality of associated dials, although only one such dial is indicated in the embodiment being illustrated.

More particularly illustrated in FIG. 2 is a dial 142 having situated thereon data indicia constituting measurements of information by means of which consumed power can be indicated. Also indicated in FIG. 2 is a pointer 144 mounted on the shaft 140 and rotatable therewith in accordance with the amount of power being consumed. This pointer will point to and select from the indicia represented on the face of dial 142 so that information can be visually perceived relative to such dial.

In accordance with the invention, there is mounted on the pointer 142 and rotatable therewith an encoding cylinder or drum 146. The encoding cylinder has thereon a generally indicated encoding mask 148, which will be described in greater detail hereinafter.

Also illustrated in FIG. 2, is a light source such as, for example, an L.E.D. of the type previously referred to hereinabove. Such L.E.D. is indicated at 150 and constitutes a point source of light of preferred type, although, under certain circumstances, other types of light sources, such as incandescent lamps and the like may be employed.

Still further indicated in FIG. 2 is the above described optical system, in this case constituted by a positive lens 152 and a cylindrical lens 154. The purpose of this lens system and the light source is to direct light along a path indicated, generally, at 156 across the face of the dial and laterally or diametrally through the encoder drum 146 to be encoded thereby. The thusly encoded light is picked up by a photoelectric transducer 158 and passed via line 160 to the circuitry which has been described in greater detail above with reference to FIG. 1. It is to be understood that the L.E.D. 150 and the photoelectric detector or transducer 158 may be embodied in a compact miniaturized circuit involving the use of printed circuits and solid state elements by means of techniques which per se do not form a part of this invention.

Figure 3:
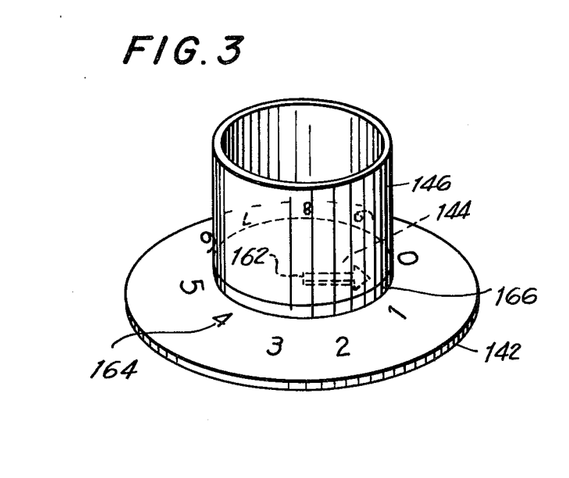
FIG. 3 is a diagrammatic view of a dial in a meter arrangement, which has been adapted according to the invention.

FIG. 3 illustrates diagrammatically the form of the aforesaid dial 142 and the pointer 144 discussed above relative to FIG. 2. Also indicated in FIG. 3 is the visible end 152 of the rotating shaft 140, which was also mentioned hereinabove. In FIG. 3 is furthermore visible the data indicia 164, these indicia, in the present case, consisting of numbers. It will be understood that one dial can be provided for each order of significance. Thus, for example, the dial 142 illustrated in FIG. 3 may be of the order of significance of units, but may, furthermore, be of various orders, such as $10^2$, $10^3$, $10^4$ ... $10^n$. The cylinder or drum 146 is preferably of a light-weight transparent plastic having a base 166. This base has a groove formed therein to receive the pointer 144, which is thereby affixed to the drum for concomitant rotation or displacement. Other forms of connection between the pointer 144 and the drum 146 are possible, but the particular form which this connection takes is of no moment in comparison with the more significant features of the invention.

Figure 4:
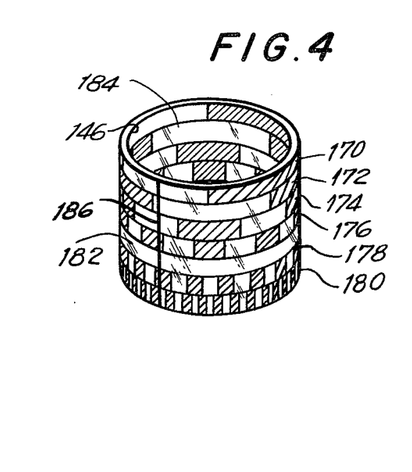
FIG. 4 is a diagrammatic view of an encoding device employed in accordance with the invention.

FIG. 4 illustrates the encoding of the drum 146. In the illustrated form appear a number of encoding rings 170, 172, 174 176, 178 and 180. The number of encoding rings may be greater or lesser than the illustrated number, provided that sufficient information is made available by virtue of the number of encoding rings provided.

An important feature of one embodiment of the invention appears in FIG. 4 in the form of transparent annular ring 182. All of rings 170–180, as well as ring 182, may be embodied on a flat-flexible mask which can be applied to the encoder drum 146 to encircle the same along the entire 360° periphery thereof. The masking elements in the various rings 170–180 are displaced relative to an impinging focused light beam, by rotation of the drum as a consequence whereof the focused light beam is modulated with the information on the rings and becomes a carrier of data. It will be noted that the drum 146 has an unimpeded interior bore 184 which does not per se impart movement or direction to the light beam passing through the drum. It is indended that the drum be scanned at any given time along, for example, the line 186 which runs parallel to the axis of symmetry or axis of rotation of the drum 146, or along any line which is parallel to the line 186. However, it will be appreciated that light passing into the encoding drum 186 while interrogating the information thereon will have to escape some way and that if the same attitude is retained, such light will be remodulated for a second time. This is undesirable inasmuch as undesired information will be superposed on desired information as a consequence of which nothing of significant value can be obtained. It will also be appreciated that if the light passing into the drum at line 186 can be shifted to an orthogonally disposed disposition such light may be passed out of the drum via the transparent ring 182. It is the provision for this transformation of the light beam (or in other words, the simultaneous rotation and displacement of the light beam about the optic axis) which forms a significant feature of one of the embodiments of the invention.

Other known methods which appear to be in use employ encoder discs. Light impinges on the tops of the discs and is detected on the bottom by photosensors placed at each "bit" location. Each disc is illuminated from the top. Individual photosensors or fibre optic branches corresponding to each section of the mask detect the position of the mask with respect to the entering light beam.

Some of the currently available electric or utility meters, however, only have about ⅜ inch space between the glass cover and the dial face. There is very little room to place light sources, fibre optics or photodetectors bertween the dial and the inside of the glass cover. With the use of the encoder drum, as has been illustrated above, illumination may take place in a sideways or lateral direction. The problem of locating components is much reduced and, in fact, the system of the invention can be installed without a changing physical dimensions of most, if not all, of the currently available meters.

Figure 5:
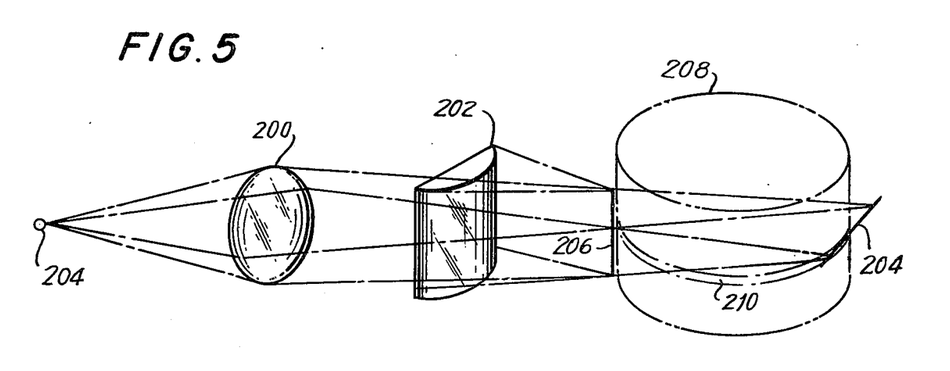
FIG. 5 is a diagrammatic illustration of the optical system employed in accordance with the preferred embodiment of the invention.

With reference to FIG. 5, it will be seen how use of a cylindrical lens in a convergent light beam is made to obtain two orthogonal images or lines in conjunction with drum encoders. In other words, the optical scheme shown in FIG. 5 is designed to project line image of a light emitting diode or other light source onto the wall of an encoder drum. Such line images are formed by means of cylindrical lenses. Light from a single L.E.D. or other such light source is coupled to the encoder drum via a positive lens, and a cylindrical lens. The technique makes use of a unique optical property resulting from the use of a cylindrical lens in a convergent light beam. This property is the formation of two line images, perpendicular to one another, and separated by a controlled distance. In the illustrated instance, the distance between the line images is made identical to the drum diameter. The first line image is formed at a shortened focal length of the objective lens, resulting from the added power of the cylindrical lens. The second line image is formed at the original focal length of the positive objective lens. This technique allows for a very convenient method of interrogating the cylindrical drum and afterwards collecting the light that passes through the drum. Although the use of cylindrical lenses in a convergent light beam to obtain orthogonal images is generally known, it is not known for purposes of collecting data as employed in accordance with the present invention.

In FIG. 5 is shown a positive objective lens 200 and a cylindrical lens 202 arranged symmetrically with the objective lens 200. Light passing from a point source, such as indicated at 204, and constituted preferably by an L.E.D. or the like passes through lens 200 and forms a convergent beam of rays. Normally, the focal length of the lens 200 occurs at line 204. The power of the cylindrical lens 202 causes a foreshortened focal length indicated at 206. The distance between the lines 204 and 206 is made to correspond to the encoder drum, such as indicated at 208, this encoder drum corresponding to the encoder drums referred to hereinabove. Although the lines are shown as slightly exceeding the diameter of the drum, it will be understood that this distance can be controlled by appropriately dimensioning the lenses and the lines can be made to lie directly on the drum surface or within the drum or slightly outside of the same.

Operation of the cylindrical lens 202 places line 206 in upright attitude, whereas the cooperation of the cylindrical lens 202 with lens 200 causes the line 204 to have a horizontal attitude which is perpendicular or orthogonal relative to line 206. Line 206 lies in a plane forming the plane of symmetry of lenses 200 and 202 in a vertical sense, whereas line 204 lies in a plane which cuts transversely across lenses 200 and 202. These two planes intersect along a line (not shown) which passes diametrally through the cylindrical encoder drum 208 and, thus, passes from the encoding or modulating station in the vicinity of line 206 to a second station at the line 204 whereat the light escapes without further modulation or distortion through the clear or transparent ring which has been referred to hereinabove and is indicated in the present illustration at 210. The first line image, thus, provides for interrogation of the encoding mask at a peripheral zone on the drum 208, whereas the second line image provides at a second peripheral zone for escape and detection of the light. Lines 204 and 206 also lie in two vertical planes which are parallel and spaced by substantially the diameter of the encoder drum (such planes correspond, for example, to the left hand and right hand edge lines of drum 56 in FIG. 1).

Most techniques used for the meter encoders of the prior art use fibre optics to couple light into the encoder. Another fibre optic branch is used to relay the light which interrogates the encoder mask for coupling to photodetectors. Fibre optics is rather lossy and the light sources used are, generally, high intensity tungsten lamps requiring considerable power.

The optical system in this invention forms a discrete line image by the use of lenses. Since light is used very economically and effectively, a relatively low powered light emitting diode can be employed. The advantages of using a light emitting diode rather than a tungsten lamp include that L.E.D.s use much less power and have extremely long life expectancies. Furthermore, L.E.D.s can be modulated at high frequencies for convenient signal processing and thereby to interface with existing electronics.

The different rings (excluding the transparent ring referred to hereinabove) on an encoder drum are each intended to represent one bit (i.e. a one or a zero) of information in a string of bits representing a decimal figure or the like. In some instances, the collection of rings on a single encoder drum can be simultaneously scanned at one time by a collection of photodetectors each one corresponding to one of the rings. This technique represents a variation in the invention which will be treated further hereinafter.

By use of a motor driven mask referred to, generally, hereinabove, each digital bit on the encoder drum along a particular scan line can be scanned sequentially. This allows the use of a single photoelectric detector for each encoder drum instead of having to detect each bit on the drum with a separate photodetector. The technique of using a separate detector for each encoder bit, while useful under certain circumstances, increases the complexity of the meter encoder system and multiplies its cost. For example, two drums with seven-bit encoders would require fourteen photodetectors, as well as amplifiers in connection therewith. Use of a scanning mask will reduce the number of detectors substantially, there being one for each mask which is employed and a photoelectric timing detector.

Considering the action of two orthogonal line images as they impinge upon cylindrical encoder drums, the first vertical line image interrogates the encoder mask. For a "one" condition light is transmitted by the mask and for a "zero" condition, light is blocked by an opaque section. The second line image by itself, contains no information regarding the position of the "ones" or "zeros" since the light is uniformly mixed in the line. However, by the use of a mask which uncovers each coded segment in sequence, the exact information regarding which bits are "ones" or "zeros" can be recovered in the second line image as long as the sequence of the mask is accounted for. The scanning mask is driven by means of a motorized drive in front of the various encoder drums and each individual bit is uncovered after a length of travel approximately equal to the width of the line image followed by an equal dark space for timing and separation purposes. When the mask has been driven over a length equal to the space required to uncover all bits for a single encoder drum and after the first drum bits are interrogated, a second drum is interrogated, and so on.

Figure 5A:
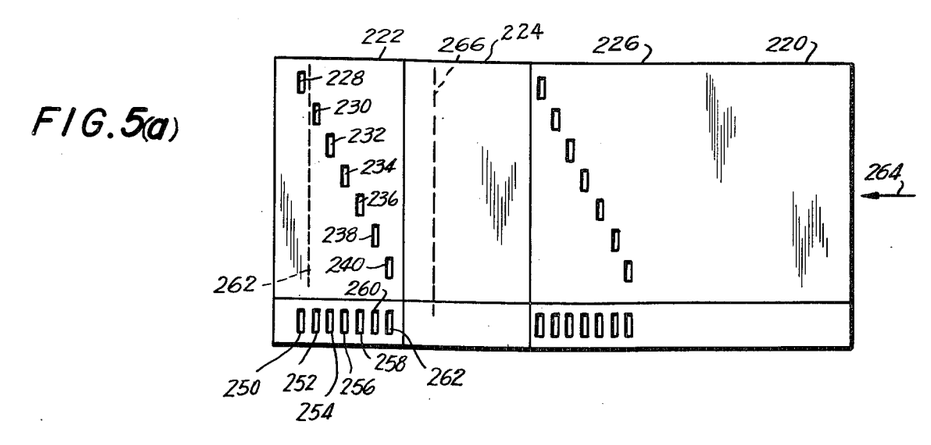
FIG. 5(a) is a plan view of a sequencing mask suitable for use with two encoder drums.

A mask configuration suitable for employment in the system of FIG. 1 is illustrated in FIG. 5a. The mask is driven by a motorized cam or suitable gear train arrangement. Before the line image can impinge upon its respective encoder drum, it is blocked by the scanner mask as illustrated by the relative positions in FIG. 1. The scanner mask has a series of staggered open segments. Each of the segments have a position and size which corresponds to an associated bit on the encoder drum. Thus, as the mask moves linearly, each sequential bit is interrogated individually by allowing only its associated portion of light from the line image of light to be transmitted. In order to separate the sequencing of various dial encoder drum channels so that signals from more than one channel are not present, without having to sequence the light sources from each channel, a blank space is inserted into the mask. The blank space width corresponds to the width needed for interrogating one channel.

On the bottom of the mask, a series of alternate open and closed segments are incorporated for timing purposes. Light from a timing L.E.D. is interrupted by the bottom section of the mask and behind the mask an associated photodetector is located. This would be the photodetector 78 in FIG. 1.

Referring now, more particularly, to FIG. 5a, there is seen a scanning mask 220 having, for example, sections 222, 224 and 226. In section 222 are openings 228, 230, 232, 234, 236, 238 and 240. Each of these corresponds transversely of the mask with a timing opening 250, 252, 254, 256, 258, 260 or 262.

If the channel 1 line image is located, for example, as shown at 262, no light will pass through any of the openings 228-240.

As the mask is driven by means (not shown) in the direction indicated by arrow 264, each one of the openings 228-240 will pass by line 262. This will mean that the passing of the openings takes place sequentially and, thus, the scanning of the line moves downwardly relative to FIG. 5a, whereby each of the information bearing rings on the encoding mask will be sequentially scanned.

The channel 2 line image is indicated at 266. This is on a separate encoding drum which has its own light source, if necessary, and has its own photodetector. This section of the mask is imperforate and, thus, being provided with no openings completely masks out examination of line 266. Therefore, drum number two or the second drum in sequence will not be examined at the same time that the first drum is examined. However, it will be noted that the second sequence of openings in section 226 are moving into position so that once examination has taken place relative to line 262, examination or interrogation can be undertaken with respect to line 266. Accordingly, each bit is examined sequentially first in one line of inspection and then in a second line of interrogation on a second drum, and so forth. Thus, a single photoelectric pickup can be employed and, additionally, if there is any intermixing of information relative to the second or interrogation station, this is a problem which is removed by use of the interrogating or scanning mask.

In the aforegoing, reference has been made to the use of "bits" and the implication has been that the binary system of numbers is employed and indeed this is possible and the binary system can be used in accordance with preferred embodiments of the invention. It is, however, possible to employ a special gray coded mask incorporated on the encoding drum for use in conjunction with the optical system discussed above. The special property of gray coding is that the code advances with only single bit changes at a time, in contrast to the binary type of code wherein there can be multiple bit changes simultaneously. The use of multiple bit changes may yield comparatively large uncertainties in the read-out when the required bit changes do not occur simultaneously. Therefore, the use of gray coded drums according to coding techniques otherwise known for other purposes, is preferred in accordance with the invention.

At the same time, it is not necessary to limit the invention to the use of bit encoding systems for it is equally possible to provide for use of an analog encoder system in the apparatus of the invention. The analog signal may change either continuously or in discrete steps, the latter being illustrated by way of example in FIG. 6.

Figure 6:
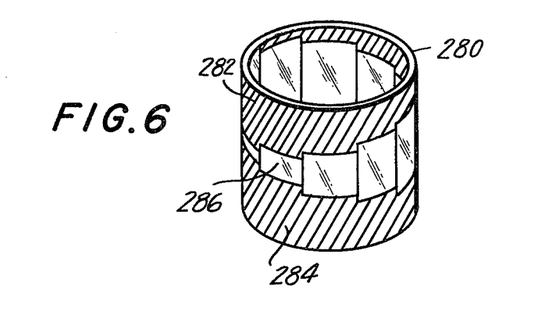
FIG. 6 shows an encoding element employed in accordance with another embodiment of the invention.

In FIG. 6 appears an encoder drum 280 wherein there are separated opaque sections 282 and 284 separated by a transparent section 286. The transparent section 286 expresses the information in analog form and, simultaneously, provides the transparent ring by means of which information in the form of modulated light can pass through and out of the drum 280 according to techniques noted hereinabove.

Analog techniques can be used to read out the dials whereby the amplitude of the signal is separated into, for example, ten distinct levels. Factors such as signal-to-noise, light source uniformity, and linearity of response play an important role in an analog encoding system. Ten levels of signal amplitude separation are not difficult to achieve, but some method of signal normalization must be used to cancel out effects of amplitude drift which is especially a problem with light sources as they go through their aging cycle. An analog signal must be converted to a digital readout for transmission purposes and this requires analog-to-digital encoder or other suitable digital conversion technique.

The basic principle of an analog encoder technique is to utilize a method whereby the analog signal changes are continuously or in discrete steps in correspondence to a dial indicator.

Figure 7:
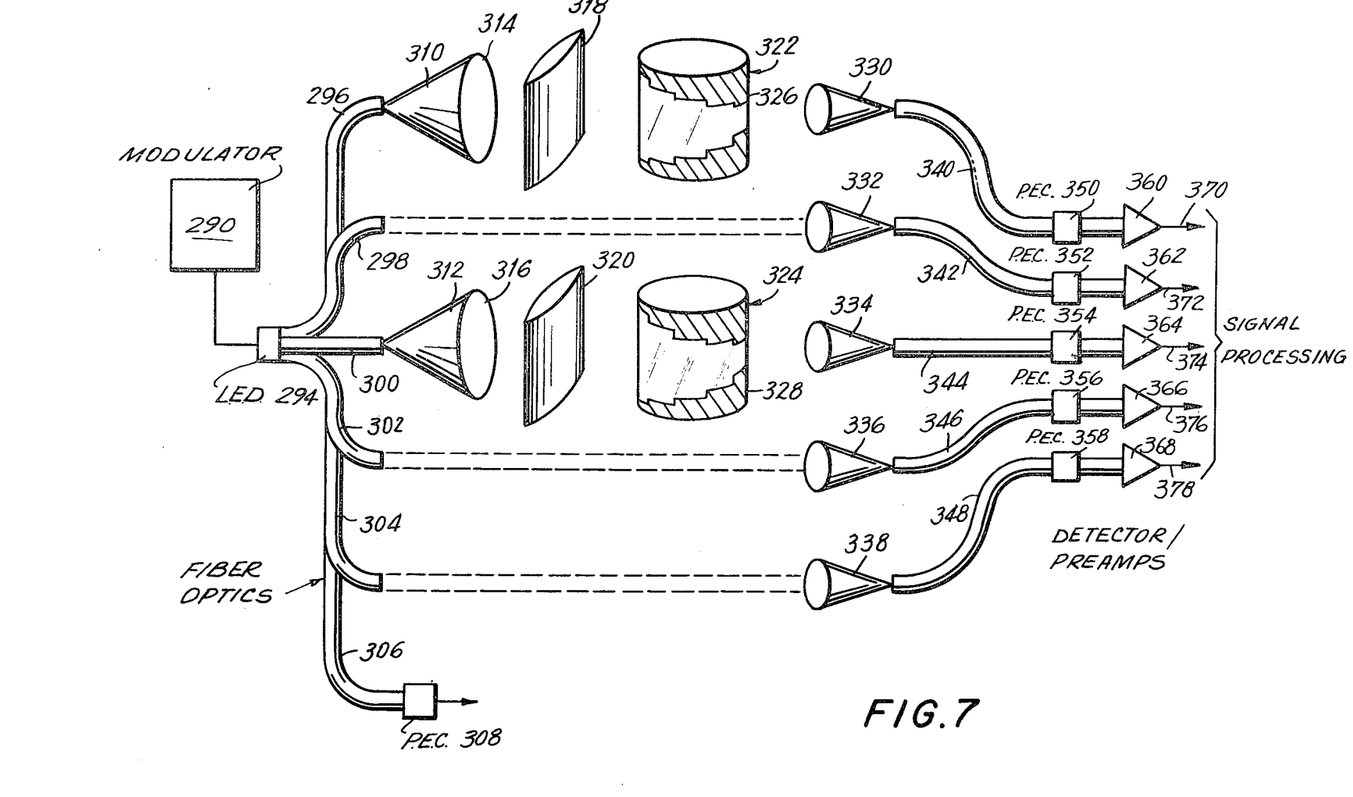
FIG. 7 is a diagrammatic representation of a system developed according to another embodiment of the invention.

The optical scheme shown in FIG. 7 is designed to project line images of a light emitting diode light source onto the walls of encoded cylinders. Line images are formed by means of cylindrical lenses. The light from a single LED is coupled to the encoder drums via a fibre optic branch, positive lenses, and cylindrical lenses. Five identical optical channels are illustrated in the figure. The technique used here again makes use of a unique optical property resulting from use of a cylindrical lens in a convergent light beam. This property, as has been described, is the formation of two line images, perpendicular to one another and separated by a controlled distance. The first line image is formed at a shortened focal length of the objective lens, resulting from the added power of the cylinder. The second line image is formed at the original focal length of the positive objective lens.

More particularly, FIG. 7 illustrates a modulator 290 coupled via a line 292 to an L.E.D. light source 294. From the light source 294 extend separate bundles of fibre optics indicated at 296, 298, 300, 302, and 304, as well as a sixth bundle 306 which carries light to a reference photo cell 308.

The output beams of light are indicated, generally, at 310 and 312 it being understood that there are three additional beams of light, all of which are serviced by lens systems diagrammatically indicated as positive lenses at 314 and 316 followed in sequence by cylindrical lenses 318 and 320, respectively. It will, of course, be realized that there are five such positive lenses and cylindrical lenses in the illustrated arrangement. Similarly, there are five encoder drums such as indicated at 322 and 324 having thereon encoder masks 326 and 328.

The emerging light beams are indicated at 330, 332, 334, 336 and 338. They are carried by fibre optic bundles 340, 342, 344, 346 and 348 to photoelectric detectors 350, 352, 354, 356 and 358. These photoelectric detectors are in turn connected to amplifiers 360, 362, 364, 366 and 368 which in turn are connected via lines 370, 372, 374, 376 and 378 to signal processing means to be indicated hereinafter with reference to FIG. 8.

Analog to digital normalization will be required in the present case inasmuch as the drum encoders referred to hereinabove were of the analog type. An analog to digital converter requires a reference voltage input which will control the peak output voltage of the analog to digital converter. Usually, this voltage is controlled by a Zener diode input. However, in the present case, the inputs to the encoder masks are line images derived from a light emitting diode source. The light emitting diode output may vary with temperature, current, age, and so on. In order to cancel out the effects of L.E.D. output variation, a light reference channel is used which taps off a small amount of light emitting diode output via a portion of the fibre optics bundle. This has been indicated hereinabove in the form of bundle 306 and photoelectric detector 308.

The light reference channel, after detection and amplification, serves as the reference voltage to the analog to digital converter. As the L.E.D. output varies, all signal channels will vary proportionately since they are derived from a common L.E.D. In addition, since a portion of the light is used to reference the analog to digital converter, the resulting digitally converted analog signals will not vary as a result of L.E.D. output variation.

Figure 8:
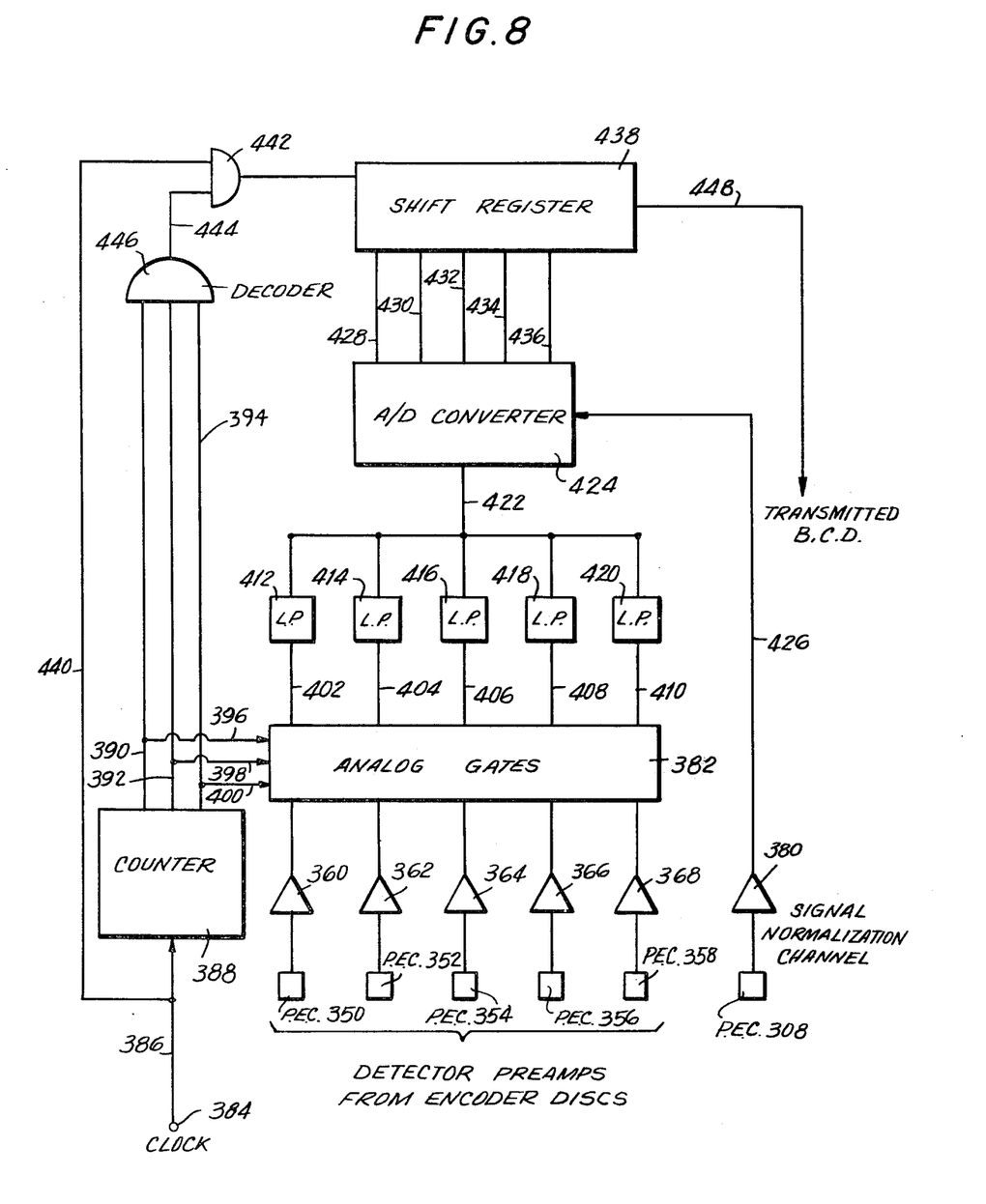
FIG. 8 illustrates diagrammatically a system to be employed, preferably in combination with the system of FIG. 7.

The system electronic block diagram for the analog to digital converter with analog to digital reference normalization is shown in FIG. 8. A signal analog to digital converter is used in conjunction with a shift register which stores the bits from the analog to digital converter to be transmitted out to a central data handling station. The individual detector preamp channels servicing the encoder drums are multiplexed serially by a counter through analog gates.

More particularly, in FIG. 8 are illustrated the photoelectric detectors 350, 352, 354, 356 and 358 referred to hereinabove. Also shown is the photoelectric detector 308 and an amplifier 380 connected therewith. As indicated above, the various photoelectric detectors 350-358 are connected respectively to amplifiers or preamplifiers 360, 362, 364, 366 and 368. These, in turn, feed into analog gates indicated, generally, at 382. A clock signal arriving at terminal 384 is fed via lines 386 to a counter 388 having output lines 390, 392 and 394. These lines are respectively connected via lines 396, 398 and 400 to the analog gates 382 whose output is fed via lines 402, 404, 406, 408 and 410 through low pass filters 412, 414, 416, 418 and 420, and thence via line 422 to the analog to digital converter 424.

As the L.E.D. output varies, the signal picked up by photoelectric detector 308 and fed via amplifier 380 will vary. This causes a correcting signal to be passed via line 426 to the analog to digital converter 424. The output of analog to digital converter 424 being thusly corrected passes via lines 428, 430, 432, 434 and 436 to a shift register 438.

The clock signal arriving at terminal 384, in addition to passing along line 386, is passed along line 440 to a gate 442 receiving another input via line 444 from a decoder 446. The decoder takes the output of counter 388 received via lines 390, 392 and 394, decodes the same and passes its signal as appropriate to gate 442 so that an output is transmitted from the system via line 448, this signal passing to the transponder as shown, for example, with reference to FIG. 1 and thence to the central data collecting station.

In the system described above with reference to FIGS. 7 and 8, it will be noted that the light source or L.E.D. 294 is modulated by modulator 290. This is done in order to discriminate against background light. The L.E.D. is thus modulated preferably at a frequency considerably higher than the incoming clock frequency. Modulation of the light source is effected to render it distinct from competing light sources, such as sunlight, street light and so forth. The detector preamps can be tuned to detect the modulation signal after signal rectifiers and low pass filters are used to obtain a DC signal suitable for analog to digital conversion.

Figure 9:
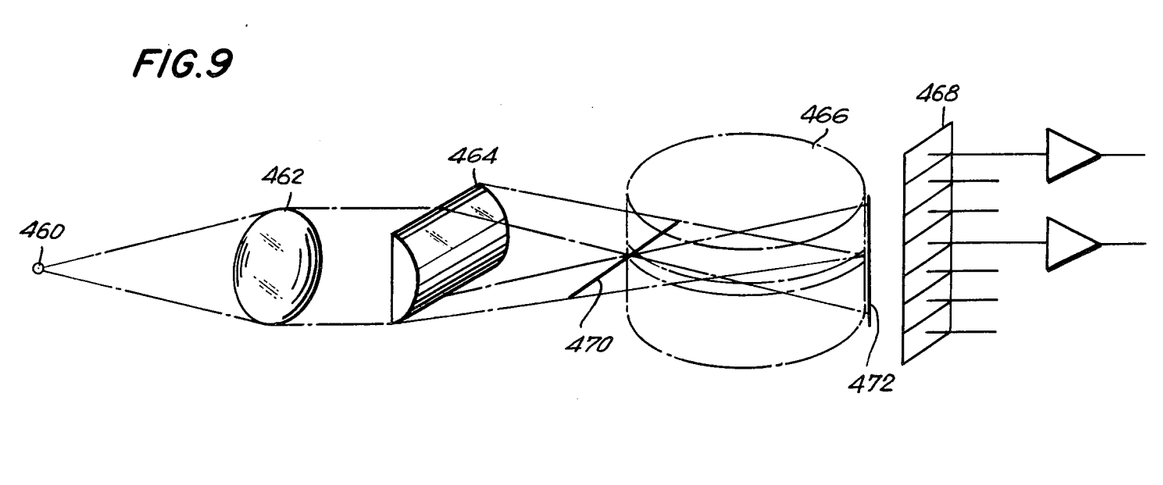
FIG. 9 illustrates still a further system developed in accordance with another embodiment of the invention.

An optical arrangment is next described relative to FIG. 9 which reverses the order of the line image formation. This arrangement is especially suitable for the elimination of the scanning mask and for the substitution of a plurality of photodetectors. In this embodiment, the same basic optical principal is used as in the aforegoing techniques with one principle change.

In FIG. 9 appear an L.E.D. 460, a positive lens 462, a cylindrical lens 464, encoder drum 466 and photodetector 468. The position of lens 464 is rotated 90° so that the first station produces a horizontal image 470 which travels through the transparent middle band of drum 466 and forms a vertical line image 472 at the second station. The encoded information is now obtained by placing photodetector 468 of $n$ elements at the second station. Each element of the $n$ detector array coincides with one of the parallel bands of the Gray code. The photosensors are positioned close to the cylindrical drum in this instance so that the "modulated" or encoded information does not become diffused through defocussing. Thus, the detector array should be within 0.01 inch of the cylindrical drum wall to limit defocussng effects.

Figure 10:
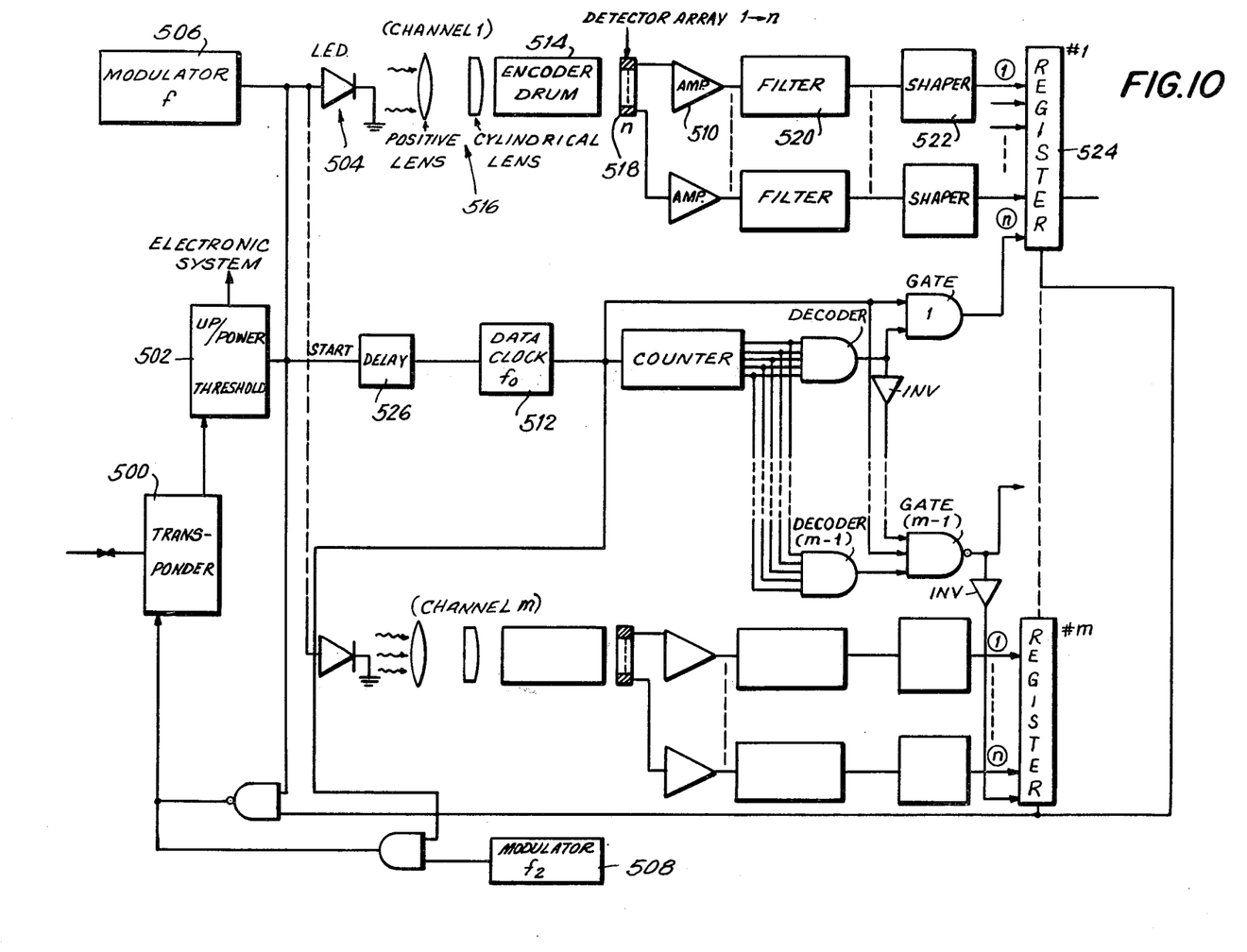
FIG. 10 is a block diagram of a further system to be employed, preferably in combination with the system of FIG. 9.

The electronic system in FIG. 10 is used in conjunction with the reversed order line image optical system of FIG. 9. The circuit of FIG. 10 is based on an $n$ binary bit system with $m$ encoded channels. The bit number $n$ refers to the number of parallel encoder bands on a single drum encoder and $m$ refers to the number of meter dial channels upon which an encoded drum and its associated electro-optical parts are employed. The signal from a transponder 500 up powers the threshold detector 502, turning on the L.E.D. 504, modulators 506 and 508, amplifiers 510, a data clock 512 and other digital logic constituting the electronic system to which detector 502 is connected by lines (not shown). The L.E.D.'s are modulated at frequency $F_1$. The L.E.D. outputs are coupled into respective of the drum encoders 514 and $n$ detector arrays 518 by the optical system 516. Each of the detectors in an $n$ array 518 corresponds to one of the Gray encoded bands on the drum encoder. The resultant signals from the $n$ detector array are fed to amplifier 510 and then to filter 520 and shaping network 522. The inputs to the parallel-in/serial-out shift register 524 are in the form of binary "ones" and "zeros". The data clock at frequency $F_o$ is used to clock the data in channels 1 through $m$ out of the registers and back to the transponder for further relaying to a centralized data processor. An analog delay circuit 526 is used to delay the clock by a time interval sufficient to insure that photo detector data is loaded into the registers prior to clocking the shift registers.

Each L.E.D. channel corresponds to a particular dial on a meter. However, every dial on the meter does not necessarily require processing since sufficient resolution can be obtained on an individual dial by adding more bits. For example, a 4 bit dial encoder provides information, slightly more than sufficient for dial numbers 1 to 10. However, by increasing a dial encoder resolution to 7 bits, the dial position can be determined to 1 part in 128 ($2^7$). Since the adjacent dials are 10 to 1 in their numerical order, the adjacent lower order dial can be skipped. Thus, for a four-dial meter, which has a readout capability to 10,000 units ($10^4$), only two dials need be encoded by using a 7-bit encoder for the most significant dial (number 1) and third dial.

The data registers are sequenced serially by means of the decoders 1 to $m$. After a given count $n$, the first decoder disables the first register and enables the second register, and the data clock empties the content of the second channel into the data line. The second decoder at count $2n$ disables the second register and enables the third register, and the third channel empties its contents into the data line. Finally, decoder $m$-1, at count $(m-1)n$ disables register $m$-1 and clocks the $m$ register contents into the data line. After count $mn$, all data is clocked into the line. At count $(mn+1)$ decoder $m$ down powers the electronics and returns the system to its starting state.

In order to deliver signals suitable for transponder operation, signals in the order of 2KH$_2$ are needed. The data clock operates at a low frequency in the order of 30hz and is not suitable for transmitting through the power lines. Thus, the clock pulse also serves as an "and" signal for operating a data look signal at $F_2$. Thus signal bursts of 2KH$_2$ are transmitted for time durations dictated by the clock pulse width. The actual data pulses are combined with signal bursts at $F_1$. Thus the presence of signals at $F_1$ ("zero") are examined simultaneously with look signals at $F_2$.

From the description of the various circuits and apparatus provided hereinabove, it will now be evident that there are many modifications possible within the scope of the invention and it will be further appreciated that the invention can be considered according to its various aspects. Thus, for example, in accordance with one of its aspects, the invention can be considered as providing an apparatus comprising coding means adapted for being interrogated by electromagnetic rays along a first plane at a first station and for passing through said electromagnetic rays along a second plane (e.g. page 2 in FIG. 5) angularly related to said first plane in a second station spaced from the first station. The first station will be constituted by the portion of the encoder drum interrogated by the light arranged in one line, whereas the second station may be considered to be the diametrally opposed surface of the encoder drum at which the light exits therefrom along a line which is perpendicularly related to the first line. The planes referred to above will intersect, generally, along a line passing through both said stations and there will, furthermore, be provided means for transmitting electromagnetic rays such that the same passed through this first plane in said first station and through said second plane at said second station. The utilization means associated with this circuitry and apparatus may do any number of things including those set forth hereinabove.

The cylinder or drum constituting the coding means referred to hereinabove may have an axis of symmetry and may be a cylinder. However, it is also possible to constitute the mask in the form of an endless loop which is oblong in nature, or in fact, to use other forms involving the various features of the invention. The coding means will, nevertheless, have thereupon some code in binary, digital, analog, Gray or other forms suitable for conveying information via light or other such electromagnetic rays or beams. The coding means, moreover, may be considered as having two connected portions adapted to intersect the electromagnetic rays in respective of the aforesaid stations with these portions being displaceable about an axis of rotation or the like as long as there is provided on said portions the encoded information with which the impinging electromagnetic beam or rays are to be modulated.

According to another aspect of the invention, it may be considered that there is provided apparatus comprising first means providing a path for electromagnetic rays which path passes sequentially through two spaced and angularly related lines, second means for modulating said rays at one of said lines according to a code, and third means for responding to the rays at the other of said lines and converting the modulated rays into signals of a different form of energy.

According to yet another aspect of the invention, there may be considered an apparatus comprising a plurality of dials having data indicia thereon, pointers operatively associated with respective of said dials and moveable to point to selected of said indicia, source means to direct light across the dials, and coding means having areas of different respective permiability to light and displaceable with said pointers to modulate said light according to the positions of the pointers, masking means for selectively rendering said areas effective, and transducer means to receive light from the effective areas for the generation of a corresponding electrical signal.

Considering yet another aspect of the invention, there is provided a method comprising optically examining parallel rows of optically characterized data elements passing in opposite directions through two spaced stations and provided with a light permeable channel angularly arranged relative to and passing through said rows, optical examination of the rows being effected by directing light through these stations and converging the light at spaced lines corresponding to said stations with the lines being angularly related according to the angular relationship of the rows and channels. These lines are orthogonally or perpendicularly related and the rows are driven through the station in correspondence with the movement of a pointer on a dial according to a preferred embodiment. The light is, as aforesaid, converged by passing the same through a positive lens and a cylindrical lens in sequence. The stations are made to be spaced at a distance corresponding to the difference between the focal length of the positive lens and said focal length modified by the cylindrical lens.

One specific example of the available multitude of lens system useful in the aforementioned embodiments is as follows:

(a) Parabolic objective lens: Diameter-0.7 inches
Focal length — 0.69 inches
(b) Cylindrical lens: Diameter—0.7 inches
Focal length—5.0 inches
(c) Encoder drum: Diameter—0.75 inches
Height—0.3 inches
Miscellaneous dimensions:
(1) Distance of L.E.D. to parabolic objective vertex- 1.0 inches
(2) Overall thickness of parabolic and cylindrical lens in the form of a cemented doublet—0.3 inches
(3) Distance of cylindrical lens to drum encoder—1.0 inches There will now be obvious to those skilled in the art, many modifications and variations of the methods and apparatus and circuitry set forth hereinabove. Such modifications and variations will not depart from the scope of the invention if defined by the following claims.

What is claimed is:

1. Apparatus comprising coding means adapted for being interrogated by electromagnetic rays along a first plane at a first station and for passing through said electromagnetic rays along a second plane angularly related to said first plane in a second station spaced from said first station, said planes intersecting generally along a line passing through both said stations, means for transmitting electromagnetic rays such that the same pass through said first plane in said first station and said second plane in said second station and form orthogonally related images respectively at said stations, and utilization means to receive the electromagnetic rays from the second station, said coding means including an encoding member adapted for the passage of said rays therethrough and having coding elements at least in opposite peripheral zones corresponding to said stations, said encoding member being provided with a channel transparent to said rays at said second station, said channel corresponding with said second plane at said second station.

2. Apparatus comprising coding means adapted for being interrogated by electromagnetic rays along a first plane at a first station and for passing through said electromagnetic rays along a second plane angularly related to said first plane in a second station spaced from said first station, said planes intersecting generally along a line passing through both said stations, means for transmitting electromagnetic rays such that the same pass through said first plane in said first station and said second plane in said second station, and utilization means to receive the electromagnetic rays from the second station, said coding means including a cylinder having an axis of symmetry and having thereon encoded information adapted for being scanned by electromagnetic waves along said first plane which is parallel to said axis, said cylinder further including an area in said second plane which is perpendicular to said axis and which is transparent to said electromagnetic waves.

3. Apparatus as claimed in claim 1 wherein said coding means includes at least two connected portions constituting parts of said encoding member and adapted to intersect the electromagnetic rays in respective of said stations, said portions being displaceable about an axis of rotation and having thereon said coding elements which are adapted for being scanned by said electromagnetic rays along said first plane which is parallel to said axis, said portions further including said channel which is perpendicular to said axis.

4. Apparatus as claimed in claim 2 comprising a dial provided with indicia of values and a dial pointer operatively associated with said dial and displaceable relative thereto for selectively indicating selected of said values, said cylinder being displaceable with said pointer for the encoding of the selected values.

5. Apparatus comprising first means providing a path for electromagnetic rays which path passes sequentially through two spaced and angularly related lines, said lines constituting spaced and orthogonally related images, second means for modulating said rays at one of said lines according to a code, said second means including an encoding member through which said rays can pass, said encoding member being rotatable with opposite peripheral zones located at said lines, said encoding member having coding elements for modulating said rays at said one line and being provided with a clear channel for passing through the thusly modulated rays at the other of said lines, and third means for responding to the rays substantially at the other of said lines and converting the modulated rays into signals of a different form of energy.

6. Apparatus as claimed in claim 5 comprising a source of light constituting said electromagnetic rays, said first means converging said light at said first and second lines respectively.

7. Apparatus as claimed in claim 6 wherein said source of light includes an L.E.D.

8. Apparatus as claimed in claim 6 wherein said encoding member includes a carrier having areas substantially opaque and transparent to said light and arranged according to a code.

9. Apparatus as claimed in claim 8 wherein said areas are arranged according to a digital code.

10. Apparatus as claimed in claim 8 wherein said areas are arranged according to an analog code.

11. Apparatus as claimed in claim 8 wherein said areas are arranged according to a gray code.

12. Apparatus as claimed in claim 8 wherein said carrier is in the form of a closed loop arranged to intersect said path at both said lines, said carrier having a transparent zone constituting said clear channel.

13. Apparatus comprising first means providing a path for electromagnetic rays which path passes sequentially through two spaced and angularly related lines, second means for modulating said rays at one of said lines according to a code, and third means for responding to the rays substantially at the other of said lines and converting the modulated rays into signals of a different form of energy; said apparatus further comprising a source of light constituting said electromagnetic rays, said first means converging said light at said first and second lines respectively, said second means including a carrier having areas substantially opaque and transparent to said light and arrayed according to a code, said carrier being in the form of a closed loop arranged to intersect said path at both said lines, said carrier having a transparent zone corresponding to one of said lines, said carrier being cylindrical and said zone being a transparent ring encircling the carrier.

14. Apparatus as claimed in claim 6 comprising means to modulate said light to an identifiable frequency.

15. Apparatus as claimed in claim 8 wherein said carrier is provided with an unimpeded path between said lines.

16. Apparatus as claimed in claim 6 wherein said first means comprises in sequence a positive lens having a characteristic focal length providing a convergent light beam, and a cylindrical lens arranged to pass said convergent light beam, the first line resulting at the focal length of the positive lens shortened by the added power of the cylindrical lens and the second line resulting at the said characteristic focal length.

17. Apparatus as claimed in claim 13 comprising a dial having measurements thereon and a pointer operatively associated with said dial to point to selected measurements thereon, the cylindrical carrier being operatively associated with and moveable with said pointer for the modulating of said rays.

18. Apparatus as claimed in claim 8 comprising a displaceable mask having light permeable regions therein for selectively rendering a limited number of said areas effective at a given time.

19. Apparatus comprising a plurality of dials having data indicia thereon, pointers operatively associated with respective of said dials and movable to point to selected of said indicia, source means to direct light diametrally across the dials, encoding means having areas of different respective permeability to light and displaceable with said pointers to modulate said light according the positions of the pointers, masking means for selectively rendering said areas effective, and transducer means to receive light from the effective areas for the generation of a corresponding electrical signal, said encoding means including a rotatable member with said areas thereon and provided with an axis of rotation and a transparent channel perpendicular to said axis, and means to converge said light at two spaced and orthogonally related lines corresponding to opposite peripheral zones on said member and which are respectively parallel and perpendicular to said axis, the line perpendicular to said axis corresponding to said transparent channel.

20. Apparatus as claimed in claim 19 wherein said areas are arranged in rows in each of which the areas combine to provide a coded representation of data, said masking means sequentially rendering the areas in one of said rows effective.

21. Apparatus as claimed in claim 20 wherein said encoding means are operatively associated with respective of said dials and pointers and said masking means renders active only one of the encoding means at a time.

22. Apparatus as claimed in claim 21 wherein said masking means provides for generating a synchronization signal for identifying the areas which are rendered effective.

23. Apparatus as claimed in claim 22 comprising a light souce and photoelectric means operatively associated with the masking means to generate said synchronization signal in the form of a sequence of pulses, and electronic counting means to count said pulses.

24. Apparatus as claimed in claim 19 comprising power means activated by an externally supplied signal to activate said source means.

25. Apparatus as claimed in claim 23 comprising frequency modulating means for modulating said source means and light source to different frequencies, said transducer means and photoelectric means generating respective pulses modulated at different frequencies.

26. Apparatus as claimed in claim 25 comprising transponder means for transmitting said pulses to a remote central station 27. Apparatus comprising a dial, a pointer moveable relative to said dial, an encoder superposed above said dial and moveable with said pointer, a light source transmitting light across said dial and intersecting with said encoder at two zones, said encoder having thereon rows of areas for modulating said light at one of said zones and further having a transparent line for permitting the passage of said light at the other of said zones, the transparent line being orthagonally related to said rows, and a lens system between said source and encoder for converging the light to a line parallel to said rows at said one zone and to a line substantially coincident with said transparent line at said other zone.

28. Apparatus as claimed in claim 27 wherein said lens system includes a positive lens and cylindrical lens in series, said positive lens having a characteristic focal length and a focal length shortened by said cylindrical lens.

29. Apparatus comprising a dial having data indicia thereon, a pointer moveable relative to said dial for selectively pointing at said indicia, a cylinder having coded representations thereon, means coupling said cylinder to said pointer to move therewith, and a light source directing light at said cylinder to create an image of the coded representations according to the position of said pointer, said cylinder being of transparent plastic and including an optical encoder mask thereon, said mask having light intercepting elements thereon according to a code, said mask being provided with a clear annular ring dividing the mask into two sections.

30. Apparatus as claimed in claim 29 comprising means directing the light from said source diametrally through the cylinder to be encoded by said mask and to escape via said clear ring.

31. Apparatus as claimed in claim 29 comprising means directing the light from said source diametrally through the cylinder, the light entering the cylinder through the clear ring and leaving through said mask.

* * * * *